United States Patent
Kattainen et al.

(10) Patent No.: US 11,293,951 B2
(45) Date of Patent: Apr. 5, 2022

(54) ELEVATOR BRAKE RELEASE MONITORING

(71) Applicant: KONE Corporation, Helsinki (FI)

(72) Inventors: Ari Kattainen, Hyvinkää (FI); Lauri Stolt, Helsinki (FI)

(73) Assignee: KONE CORPORATION, Helsinki (FI)

( * ) Notice: Subject to any disclaimer, the term of this patent is extended or adjusted under 35 U.S.C. 154(b) by 148 days.

(21) Appl. No.: 15/215,357

(22) Filed: Jul. 20, 2016

(65) Prior Publication Data
US 2017/0067943 A1 Mar. 9, 2017

(30) Foreign Application Priority Data
Sep. 7, 2015 (EP) .................................. 15184017

(51) Int. Cl.
*B66B 1/32* (2006.01)
*B66B 5/00* (2006.01)
*G01R 19/00* (2006.01)

(52) U.S. Cl.
CPC ............ *G01R 19/0038* (2013.01); *B66B 1/32* (2013.01); *B66B 5/0031* (2013.01)

(58) Field of Classification Search
USPC ....................................................... 187/393
See application file for complete search history.

(56) References Cited

U.S. PATENT DOCUMENTS

| | | | | |
|---|---|---|---|---|
| 4,987,977 A * | 1/1991 | Nomura | ..................... | B66B 1/32 187/288 |
| 5,076,399 A * | 12/1991 | Horbruegger | ............ | B66B 1/285 187/293 |
| 6,193,026 B1 * | 2/2001 | Sevilleja | .................. | B60T 13/22 187/288 |
| 7,299,898 B2 * | 11/2007 | Husmann | ................... | B66B 5/20 187/373 |
| 7,681,693 B2 * | 3/2010 | Tegtmeier | ................. | B66B 1/30 187/288 |
| 2006/0175153 A1 | 8/2006 | Hubbard et al. | | |

(Continued)

FOREIGN PATENT DOCUMENTS

| CN | 102762481 A | 10/2012 |
|---|---|---|
| EP | 2537790 A1 | 12/2012 |

(Continued)

*Primary Examiner* — Christopher Uhlir
(74) *Attorney, Agent, or Firm* — Birch, Stewart, Kolasch & Birch, LLP

(57) ABSTRACT

It is desired that elevators are not operated when the brake is not completely released. Thus, the disengaging of brakes must be monitored or guaranteed otherwise. For providing guaranteed opening, the current for opening the brake is determined and then an additional current is provided to the brakes in order to guarantee the opening. The current for opening the brake is determined by doing a test sequence for each brake individually. In the test sequence, one brake is used to hold the elevator. Then, a momentum is applied to the elevator for moving the elevator car. The current is determined by increasing the current to the engaged brake gradually until the elevator moves. When the movement is detected, the current value is stored. When the elevator is operated regularly, the additional current is added to the stored value.

19 Claims, 3 Drawing Sheets

(56) References Cited

U.S. PATENT DOCUMENTS

| | | | |
|---|---|---|---|
| 2010/0154527 A1* | 6/2010 | Illan | B66B 5/0093 |
| | | | 73/121 |
| 2014/0311257 A1* | 10/2014 | Hubbard | B66B 5/0037 |
| | | | 73/862.12 |
| 2016/0280511 A1* | 9/2016 | Anderson | B66B 5/0031 |
| 2018/0134517 A1* | 5/2018 | Zhou | B66B 5/0037 |

FOREIGN PATENT DOCUMENTS

| | | |
|---|---|---|
| EP | 2637790 A1 | 12/2012 |
| JP | 2008-168981 A | 7/2008 |
| JP | 2008-207898 A | 9/2008 |

\* cited by examiner

ELEVATOR BRAKE RELEASE MONITORING

FIELD OF THE INVENTION

The invention relates elevators and particularly to braking systems used in elevators.

BACKGROUND OF THE INVENTION

Elevator systems are regulated all over the world. Regulations typically relate to the security of an elevator. Each elevator must fulfill the regulations and these requirements are sometimes verified regularly, for example yearly or monthly basis. Typically elevators are inspected regularly and parts not filling the requirements must be changed. As elevators are typically used for transporting passengers the security is an essential aspect. Thus, all aspects that can have a negative impact on the security should be eliminated. Sometimes a small failure in a part of the elevator may lead into severe security issues.

One of the important issues is that the elevator is operating without additional forces restricting the movement of the elevator car. One possible cause is a defect brake that is not completely disengaged and causes friction. The problem associated with this is the fact that the brake wears very fast and will not have the required braking power when it is needed. The wearing may be very fast and the dangerous technical condition occurs so that the conventional inspection frequency is not able to notice wearing early enough.

The problem mentioned above is regulated by many authorities and it is also desirable without regulation to prevent the movement of the elevator car when the brake is not completely disengaged so that possibly dangerous situation is avoided.

Conventionally displacement sensors have been used for detecting the disengagement of a brake. These sensors are additional components that are not always reliable because the mechanical movement of a brake is very small. Furthermore, sometimes the brake does not open completely but the sensor indicates that the brake has been opened but it still has a contact which will cause friction and leads into undesired wearing as discussed above. A further drawback of additional sensor is that in general, using additional components causes expenses because of additional components and additional design needed. This applies to both manufacturing and the maintenance. Thus, there is a need for reliable and cost efficient arrangement for brake disengagement monitoring.

SUMMARY

It is desired that elevators are not operated when the brake is not completely disengaged. Thus, the disengaging of brakes must be monitored or guaranteed otherwise. For providing guaranteed opening the current for opening the brake is determined and then an additional current is provided to the brakes in order to guarantee the opening. The current for opening the brake is determined by doing a test sequence for each brake individually. In the test sequence one brake is used to hold the elevator. Then a momentum is applied to the elevator for moving the elevator car. The current is determined by increasing the current to the engaged brake gradually until the elevator moves. When the movement is detected the current value is stored. When the elevator is operated regularly the additional current is added to the stored value. By doing this it is guaranteed that the brake is opened and the elevator will be safe and fulfill regulations.

In an embodiment method for determining a current required to disengage brakes of an elevator car is disclosed. The method comprises holding said elevator car stationary, engaging one brake, disengaging any other brakes, applying momentum to said elevator car for moving said elevator car, increasing current gradually to said engaged brake, detecting movement of said elevator car and storing the value of the current when said movement is detected. In a further embodiment the method further comprises holding said elevator car by using an electric drive. In another embodiment the method further comprises applying momentum to said elevator car by an electric drive. In another embodiment method further comprises applying momentum to said elevator car by using gravity force caused by the counterweight of the elevator. In a further embodiment the method further comprises determining a value for current to be used to release brakes when the elevator is in normal use. In a further embodiment the value for current is determined by adding an additional current value to said recorded value of the current.

In an embodiment the above described method is implemented as a computer program. In another embodiment the computer program is executed in an apparatus, such as a controller for elevators. In a further embodiment an elevator system comprising the apparatus is disclosed.

A benefit of the invention is that it is able to guarantee that the brakes are opened because of the additional current. This helps reducing wearing of the brakes and also in fulfilling the regulations. A further benefit of the invention is that it is suitable for all kinds of. It may be applied to elevators that use counterweights of different weight but it works also in elevators without counterweight. A further benefit of the invention is that the solution is more reliable than conventional displacement sensors. Thus, conventional displacement sensors are not needed and this will lead into cost savings both in manufacturing and maintenance of an elevator.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION OF THE INVENTION

Reference will now be made in detail to the embodiments of the present invention, examples of which are illustrated in the accompanying drawings.

Figure 1:
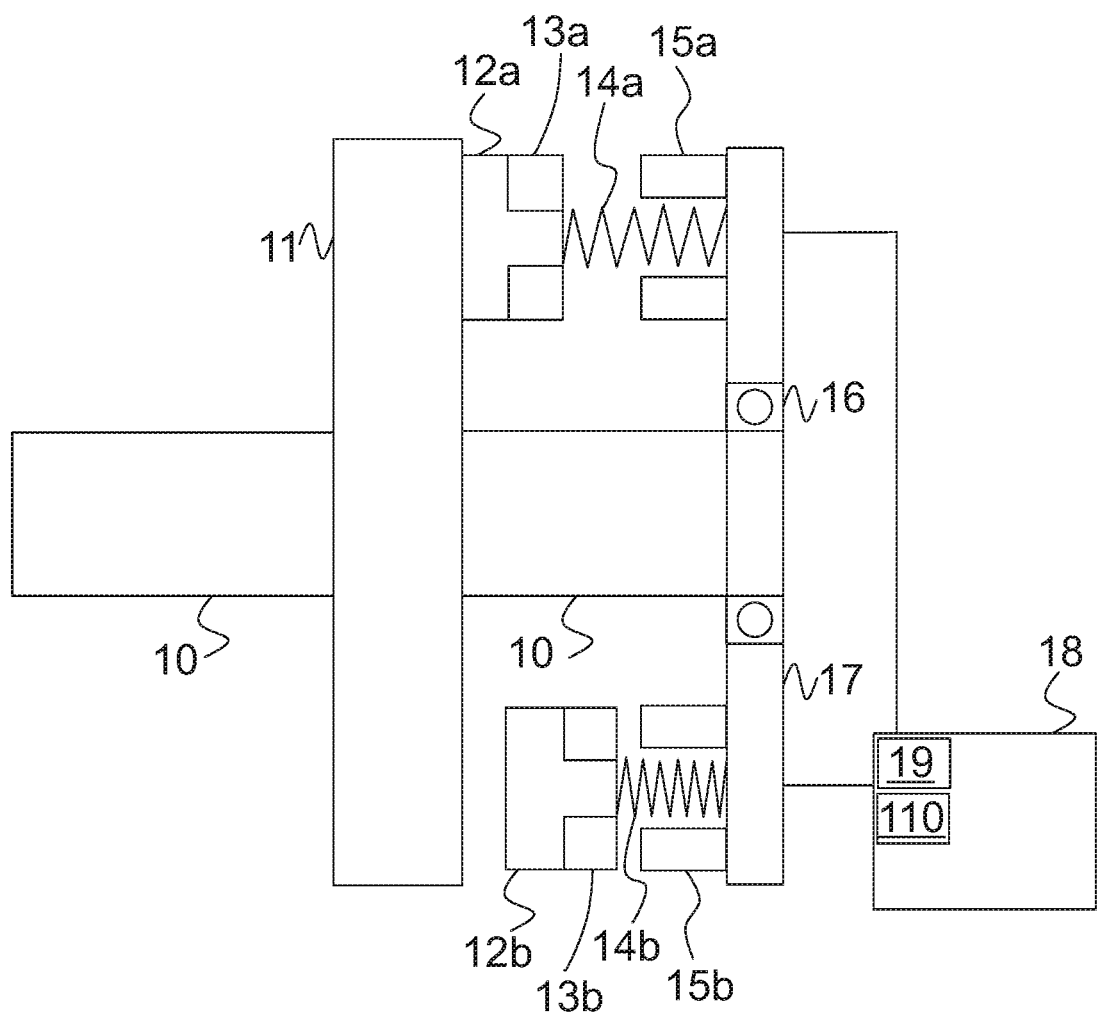
FIG. 1 is a block diagram of an example embodiment of the present invention.

In FIG. 1 a block diagram of an arrangement according to the present invention. In the figure a traction sheave 11 is attached to a shaft 10 that is connected to the hoisting machine that is not shown in the figure, however, any conventional hoisting machine known to a person skilled in the art may be used.

In FIG. 1 an arrangement relating to brakes is discussed in more detail. In figure two independently operable brakes 12a-15a and 12b-15b are disclosed. The number of brakes in the example is two, however, any other number of brakes is acceptable for the present invention. Furthermore, one brake is enough to hold the elevator car, however, two, or even more, brakes are preferred and sometimes even required by regulations. Thus, in case of a brake failure in the first brake a second brake is still operable. In normal operation all brakes are typically used at the same time.

A typical elevator brake is a brake which is kept open by using magnets 13a and 15a so that when the counterpart 15a is powered it will pull the braking portion 12a away from the traction sheave 11. When the power is off, the spring 14a will push the braking portion 12a to the traction sheave 11 and the elevator will stop. In the figure no support member is disclosed, however, a person skilled in the art understands that there are several different ways of supporting the brake so that the operation disclosed here can be achieved. In the figure brake 12a-15a is not powered at all or at least not enough to disengage the brake. The brake 12b-15b is powered enough and does not have contact with the traction sheave. This situation is in accordance with the present invention and will be explained later. In a normal operation mode both brakes are disengaged at the same time as it is forbidden to drive the elevator against a brake.

In FIG. 1 an element 17 is used for attaching the brake to the shaft 10 by using bearings 16. Furthermore, the arrangement of FIG. 1 includes a controller 18 that comprises at least a processor 19 and a memory 110 for controlling the elevator, or at least capable of controlling the elevator when the elevator is in a test mode according to the present embodiment.

Figure 2:
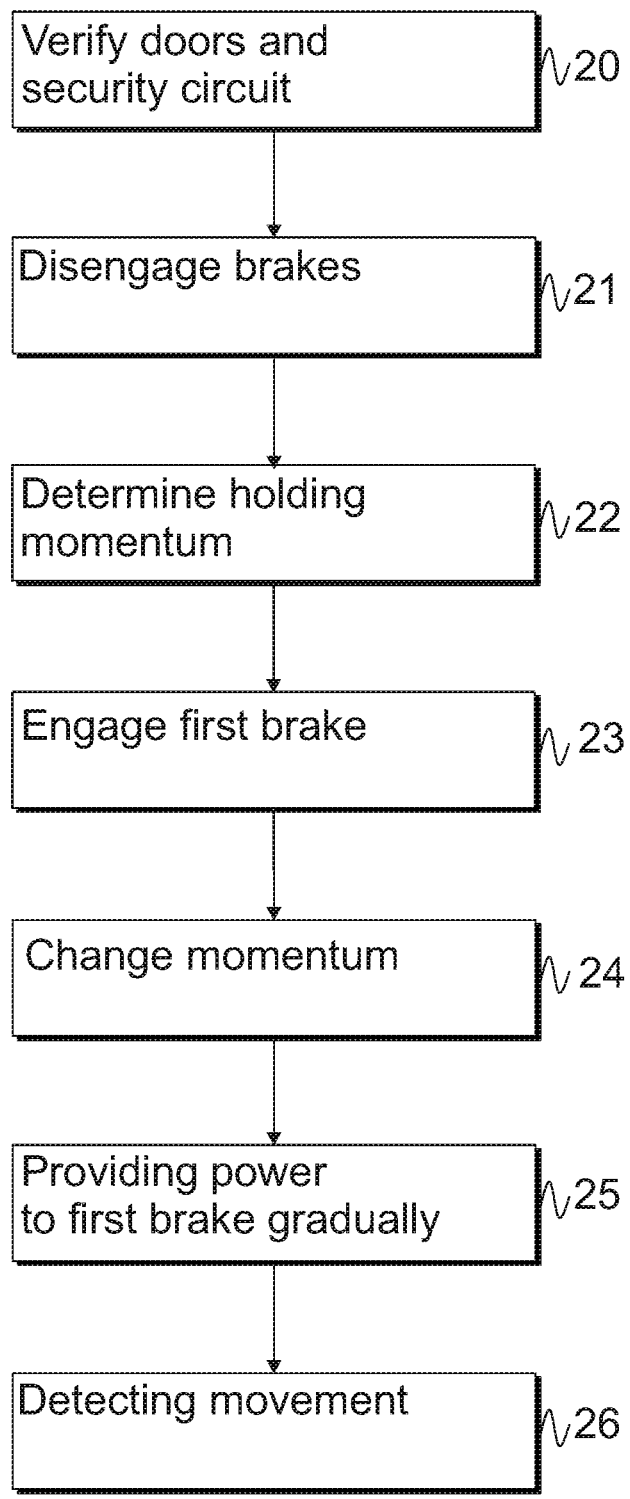
FIG. 2 is a flow chart of a method according to the present invention.

In FIG. 2 a method according to the present invention is disclosed. In the method a power level or a current for disengaging the brake is determined. The method according FIG. 2 can be used also in an elevator which is in balance when the elevator car is empty. In other words, the counterweight weighs approximately as much as the empty elevator car. The method disclosed in FIG. 2 is a test method. It is typically applied when the elevator is not in use, for example once or twice in a day during the silent period. The normal operation of the elevator may be prevented during the test sequence. Thus, calls coming during that time may be assigned to other elevators if available.

Firstly, it is determined that elevator doors are closed and the security circuit is functioning properly, step 20. Then, both brakes are disengaged by providing current large enough to open the brakes, step 21. At the same time the drive is instructed to keep the elevator car in its position. Thus, the elevator car does not move even if the brakes are opened. This corresponds with the situation wherein the elevator is in normal use and about to start a journey. The drive is instructed to hold the elevator so that a smooth start can be provided.

After disengaging the brakes the momentum needed to hold the elevator in its position is determined, step 22. Then the power is turned off from the first brake, step 23. Thus, the situation corresponds with the situation of FIG. 1, wherein the first brake is engaged and configured to hold the tractions sheave and the second brake is still disengaged. The momentum of the drive is then changed, for example, so that the resulting load to be held by the engaged brake corresponds to 20% of the nominal load of the elevator car, step 24. If the elevator does not move, it can be determined that the brake holds at least 20% momentum.

Then the power is again provided to the first brake, step 25. This is done gradually so that the power is continuously increased until the elevator car starts moving and the movement is detected, step 26. The power or current value is then recorded as a threshold value that is enough to disengage the brake. Based on this value it is then determined that, for example, 20% more current should be provided in order to guarantee the opening of the brake. There is no exact amount of additional current needed. When the additional current is too much, energy is wasted and when it is not enough the brake is not completely opened. Thus, 20% is already considerably more than the threshold value for opening the brake. The threshold value and the additional current together form normal operational current. However, the current used may be determined by the elevator designer for each elevator separately so that different types of brakes are taken into account.

When the first brake has been tested the test will be repeated for the second brake and possible additional brakes independently. Thus, the required current will be known for each of the brakes independently. Thus, if the test reveals different current values, these different values may be used later when controlling the elevator according to the detected values. However, it is also possible to use the biggest current for all brakes if individual control is not possible or desired.

Figure 3:
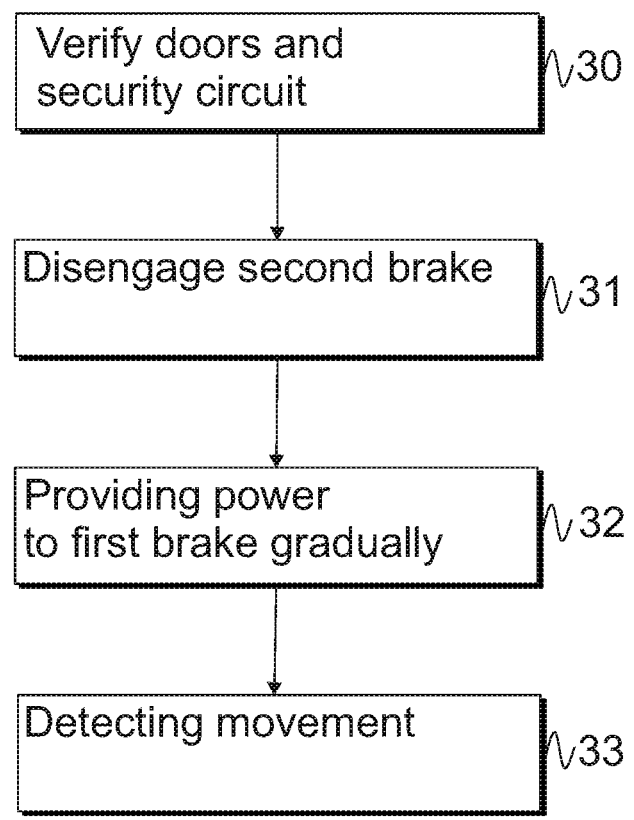
FIG. 3 is a flow chart of another method according to the present invention.

In FIG. 3 a method corresponding to the method of FIG. 2 is disclosed for an elevator where the counterweight corresponds, for example, to the weight of half loaded elevator car. Thus, an empty elevator car is not in balance with the counterweight.

The method is initiated correspondingly by verifying the doors and the security circuit, step 30. Now, when the elevator is not in balance the starting position is such that the brakes are engaged to keep the elevator at its initial position. The counterweight is trying to move the elevator car upwards because of the gravitation. Thus, the drive is not needed to cause the momentum required for the test.

In the test first the second brake is disengaged, step 31, so that the situation corresponds with the situation of FIG. 1. Then power is gradually provided to the brake holding the elevator car, step 32. This corresponds with the step 25 of FIG. 2. When movement is detected, step 33, the value for disengaging the brake can be determined, step 34. The test is repeated then for the second, and possibly additional brakes, so that each of the brakes is tested independently. Based on the determined value, an excess of, for example, 20% of current should be provided in order to guarantee the opening of the brake.

The above mentioned method may be implemented as computer software which is executed in a computing device, such as the controller 16 of FIG. 1. When the software is executed in a computing device it is configured to perform the above described inventive method. The software is embodied on a computer readable medium so that it can be provided to the computing device, such as the controller 16 of FIG. 1.

The above described method is used for determining a value that guarantees the opening of brakes. This value is later used for controlling the brakes when the elevator is in use. The test may be performed daily, or even more often. For example, it is possible that in a group of elevators the test is performed more than once a day so that during silent moments one elevator is tested and others remain operational.

For choosing the best moment of time for each test statistics and current state of the elevator system may be used. For example, if it is known that certain hour during working day is more silent than others the test may be scheduled there. However, the decision may be overruled by the current state so that if unexpected high traffic occurs all elevators remain operational. If the check is done once a day it is typically done during night time so that the traffic is not disturbed.

As stated above, the components of the exemplary embodiments can include computer readable medium or memories for holding instructions programmed according to the teachings of the present inventions and for holding data structures, tables, records, and/or other data described herein. Computer readable medium can include any suitable medium that participates in providing instructions to a processor for execution. Common forms of computer-readable media can include, for example, a floppy disk, a flexible disk, hard disk, magnetic tape, any other suitable magnetic medium, a CD-ROM, CD±R, CD±RW, DVD, DVD-RAM, DVD±RW, DVD±R, HD DVD, HD DVD-R, HD DVD-RW, HD DVD-RAM, Blu-ray Disc, any other suitable optical medium, a RAM, a PROM, an EPROM, a FLASH-EPROM, any other suitable memory chip or cartridge, or any other suitable medium from which a computer can read.

It is obvious to a person skilled in the art that with the advancement of technology, the basic idea of the invention may be implemented in various ways. The invention and its embodiments are thus not limited to the examples described above; instead they may vary within the scope of the claims.

The invention claimed is:

1. A method for determining a current used to disengage brakes of an elevator car of an elevator, said elevator car including at least two brakes, the method comprising the steps of:
    performing a test sequence for each of the at least two brakes individually at least once a day to monitor actual brake release current daily and to prevent undesired brake wearing, comprising:
        for an empty elevator car with said at least two brakes disengaged, holding said empty elevator car stationary;
        engaging one brake while all others of the remaining at least one brake are disengaged;
        while the empty elevator car remains stationary, making sure that a momentum exists such that said empty elevator car will move once the at least two brakes are disengaged;
        increasing current gradually to said engaged brake;
        detecting movement of said empty elevator car;
        storing a value of the current when said movement is detected; and
        adding an additional current value to said stored value of the current to generate a release current used to release the at least two brakes when the elevator is in normal use; and
    using said release current to release the at least two brakes when the elevator is in normal use.

2. The method according to claim 1, the method further comprising the step of holding said elevator car by using an electric drive.

3. The method according to claim 1, wherein when the elevator is in balance, the step of making sure that a momentum exists such that said empty elevator car will move once the at least two brakes are disengaged is achieved by providing the momentum by an electric drive.

4. A computer program embodied on a non-transitory computer readable medium for a computing device comprising code adapted to cause the method according to claim 1 to be performed when executed on a data-processing system.

5. An apparatus comprising:
    a processor; and
    at least one memory,
    wherein the apparatus is configured to perform the method according to claim 1.

6. An elevator system comprising at least one elevator comprising the apparatus according to claim 5.

7. The method according to claim 2, wherein the method further comprises the step of applying momentum to said elevator car by an electric drive.

8. A computer program embodied on a non-transitory computer readable medium for a computing device comprising code adapted to cause the method according to claim 2 to be performed when executed on a data-processing system.

9. A computer program embodied on a non-transitory computer readable medium for a computing device comprising code adapted to cause the method according to claim 3 to be performed when executed on a data-processing system.

10. An apparatus comprising:
    a processor; and
    at least one memory,
    wherein the apparatus is configured to perform the method according to claim 2.

11. The method according to claim 1, further comprising repeating all the steps for each brake of the at least two brakes individually, so that each of the at least two brakes is tested independently.

12. A method for determining a current used to disengage brakes of an elevator car of an elevator, said elevator car including at least two brakes, the method comprising the steps of:
    performing a test sequence for each of the at least two brakes individually at least once a day to monitor actual brake release current daily and to prevent undesired brake wearing, comprising:
        for an empty elevator car with said at least two brakes disengaged, obtaining a holding momentum needed for holding said empty elevator car stationary and holding said empty elevator car stationary;
        engaging one brake while all others of the remaining at least one brake are disengaged;
        changing the holding momentum to provide an imbalance to the elevator such that said empty elevator car will move once the at least two brakes are disengaged;
        increasing current gradually to said engaged brake;
        detecting movement of said empty elevator car;
        storing a value of the current when said movement is detected; and
        adding an additional current value to said stored value of the current to generate a release current used to release the at least two brakes when the elevator is in normal use; and
    using said release current to release the at least two brakes when the elevator is in normal use.

13. The method according to claim 12, wherein when the elevator is in balance, the holding momentum is zero, and the step of changing the holding momentum to provide an imbalance is achieved by using an electric drive.

14. A method for determining a current used to disengage brakes of an elevator car of an elevator, said elevator car including at least two brakes, wherein an empty elevator car of the elevator is not in balance with a counterweight, the method comprising the steps of:
- performing a test sequence for each of the at least two brakes individually at least once a day to monitor actual brake release current daily and to prevent undesired brake wearing, comprising:
  - engaging the at least two brakes such that the elevator is kept at its initial position;
  - disengage one of the at least two brakes, wherein the counterweight is trying to move the elevator car and thereby provides a momentum such that said elevator car will move once the at least two brakes are disengaged;
  - increasing current gradually to the remaining at least one brake that is engaged;
  - detecting movement of said empty elevator car;
  - storing a value of the current when said movement is detected; and
  - adding an additional current value to said stored value of the current to generate a release current used to release the at least two brakes when the elevator is in normal use; and
- using said release current to release the at least two brakes when the elevator is in normal use.

15. The method according to claim 1, further comprising the step of while the empty elevator car remains stationary, making sure that a momentum exists such that said empty elevator car will not move until the at least two brakes are completely disengaged.

16. The method according to claim 1, further comprising the step of while the empty elevator car remains stationary, making sure that a momentum corresponding to less than half a nominal load of the car exists such that said empty elevator car will move once the at least two brakes are disengage.

17. The method according to claim 1, further comprising the step of while the empty elevator car remains stationary, making sure that a momentum corresponding to 20% of a nominal load of the car exists such that said empty elevator car will move once the at least two brakes are disengage.

18. The method according to claim 12, further comprising the step of while the empty elevator car remains stationary, making sure that a momentum corresponding to 20% of a nominal load of the car exists such that said empty elevator car will move once the at least two brakes are disengage.

19. The method according to claim 1, wherein said additional current value is substantially smaller than said stored value of the current obtained from the test sequence.

\* \* \* \* \*